(12) United States Patent
Chen et al.

(10) Patent No.: US 8,158,519 B2
(45) Date of Patent: Apr. 17, 2012

(54) METHOD OF MANUFACTURING NON-VOLATILE MEMORY CELL USING SELF-ALIGNED METAL SILICIDE

(75) Inventors: Yi-Hsiu Chen, Chu-Pei (TW); Yung-Chung Lee, Chu-Pei (TW); Yider Wu, Chu-Pei (TW)

(73) Assignee: Eon Silicon Solution Inc. (TW)

( * ) Notice: Subject to any disclaimer, the term of this patent is extended or adjusted under 35 U.S.C. 154(b) by 501 days.

(21) Appl. No.: 12/254,022

(22) Filed: Oct. 20, 2008

(65) Prior Publication Data

US 2010/0099262 A1  Apr. 22, 2010

(51) Int. Cl.
*H01L 21/84* (2006.01)
*H01L 21/00* (2006.01)
*H01L 21/8238* (2006.01)
*H01L 21/44* (2006.01)

(52) U.S. Cl. ........ 438/682; 438/257; 438/592; 438/976; 257/E21.165; 257/E21.199; 257/E21.294; 257/E21.438

(58) Field of Classification Search ........... 257/E21.165, 257/E21.199, E21.294, E21.592, E21.976
See application file for complete search history.

(56) References Cited

U.S. PATENT DOCUMENTS

| | | | | |
|---|---|---|---|---|
| 5,563,100 | A * | 10/1996 | Matsubara | 438/303 |
| 5,902,129 | A * | 5/1999 | Yoshikawa et al. | 438/592 |
| 6,277,743 | B1 * | 8/2001 | O'Brien | 438/682 |
| 2003/0010975 | A1 * | 1/2003 | Gibb et al. | 257/40 |
| 2008/0176371 | A1 * | 7/2008 | Rao et al. | 438/257 |
| 2008/0265303 | A1 * | 10/2008 | Kwon | 257/315 |

* cited by examiner

*Primary Examiner* — Mohsen Ahmadi
(74) *Attorney, Agent, or Firm* — Schmeiser, Olsen & Watts, LLP

(57) ABSTRACT

In a method of manufacturing a non-volatile memory cell, a self-aligned metal silicide is used in place of a conventional tungsten metal layer to form a polysilicon gate, and the self-aligned metal silicide is used as a connection layer on the polysilicon gate. By using the self-aligned metal silicide to form the polysilicon gate, the use of masks in the etching process may be saved to thereby enable simplified manufacturing process and accordingly, reduced manufacturing cost. Meanwhile, the problem of resistance shift caused by an oxidized tungsten metal layer can be avoided.

8 Claims, 4 Drawing Sheets

Y axis

X axis

METHOD OF MANUFACTURING NON-VOLATILE MEMORY CELL USING SELF-ALIGNED METAL SILICIDE

FIELD OF THE INVENTION

The present invention relates to a method of manufacturing non-volatile memory cell, and more particularly to a method of manufacturing non-volatile memory cell in which a self-aligned metal silicide is used in forming the gate of a non-volatile memory cell.

BACKGROUND OF THE INVENTION

In the field of semiconductor, the non-volatile memory has been widely employed in a large number of electronic products, including digital camera memories, cellular phones, and personal computers, due to its ability of retaining the stored data even when not powered, its small volume and low power consumption, and its reusability. In a typical non-volatile memory, an element having a control gate made of a polysilicon material and a silicon-oxide-nitride-oxide-silicon (SONOS) structure is used as a control element for controlling data write-in via channel-hot-electron injection and data-erase via hot hole injection. The layers of the SONOS structure are sequentially stacked on a silicon substrate, and the nitride layer sandwiched between the upper and lower oxide layers is used as a source of charge trapping. The upper and lower oxide layers are used as an isolating layer and a tunneling layer, respectively. In the SONOS structure, the oxide-nitride-oxide (ONO) structure may be used to replace a floating gate to effectively reduce the use of masks in the manufacturing process of non-volatile memory and to reduce the size of the memory.

In the gate structure for the non-volatile memory cell, in order to reduce the sheet resistance of the polysilicon gate and the resistance values between the gate and other contacts, a metal layer would usually be further formed on the polysilicon gate to improve the relatively high resistance value of the polysilicon gate. Conventionally, a tungsten metal layer is deposited on the polysilicon gate to achieve the above-mentioned purpose. For example, Taiwan Patent Publication Number I287834 discloses a technique for further forming a tungsten metal layer on the polysilicon gate. However, the tungsten metal layer used as a cap layer on the polysilicon gate is easily subject to deterioration and involves complicated procedures to form it. After the tungsten metal layer is deposited, it must be quickly capped using the nitride layer to avoid the deterioration thereof. Meanwhile, to remove the capping nitride layer from the tungsten metal layer, masks must be used in the etching process in order to form the polysilicon gate and other patterns. Therefore, the conventional way of forming the tungsten metal layer on the polysilicon gate is uneconomical for use when the simplification of manufacturing process and the reduction of manufacturing cost of the non-volatile memory are considered.

It is therefore tried by the inventor to eliminate the drawbacks in the conventional way of manufacturing the gate for the non-volatile memory cell by providing an improved non-volatile memory cell manufacturing method, in which a self-aligned metal silicide layer is used to replace the conventional tungsten metal layer, so as to effectively avoid the problem of a deteriorated tungsten metal layer due to subsequent high-temperature tempering process, omit the use of marks in the etching process for forming the polysilicon gate, and accordingly, achieve the purpose of simplifying the etching process and reducing the manufacturing cost of the non-volatile memory cell.

SUMMARY OF THE INVENTION

A primary object of the present invention is to provide a method of manufacturing non-volatile memory cell, in which a self-aligned metal silicide layer is used in place of the conventional tungsten metal layer as a cap layer on a polysilicon gate, so as to effectively avoid the problem of a deteriorated tungsten metal layer due to subsequent high-temperature tempering process, save the use of marks in the etching process for forming the polysilicon gate, and accordingly, achieve the purpose of simplifying the etching process and reducing the manufacturing cost of the non-volatile memory cell.

To achieve the above and other objects, the method of the present invention for manufacturing a non-volatile memory cell uses a self-aligned metal silicide to form the cap layer on the polysilicon gate through the following steps:

using an acid solution to wash a silica material to be reacted with a metal material in the subsequent manufacturing process, so as to remove a native oxide from the surface of the silica material;

forming a metal layer having a thickness ranging between 30 Å and 200 Å on the acid-washed surface of the silica material at zones for forming the polysilicon gate, the source, and the drain, and on other zones through sputtering or chemical vapor deposition;

forming a barrier layer having a thickness ranging between 50 Å and 250 Å on the metal layer for protecting the metal layer against external air when the metal layer is reacted with the silicon substrate to form a metal silicide in the next step;

subjecting the metal layer and the barrier layer to a first time thermal process at a temperature ranging between 250° C. and 700° C., so that the metal layer reacts with the silicon substrate to form a metal silicide;

removing portions of the metal layer that do not react with the silicon substrate to form the metal silicide and removing the barrier layer using wet etching process, so that a self-aligned metal silicide layer is formed to cap the polysilicon gate zone, the source zone, and the drain zone; and conducting a second time thermal process at a temperature ranging between 500° C. and 900° C., so that the metal silicide is internally formed into a phase-inverted metal silicide structure to effectively reduce a resistance value of the metal silicide.

The phrase "self-aligned metal silicide" used in the present invention means that when a specific metal layer is capped on the silicon substrate and other material, such as silicon nitride, the metal layer having been heated would only react with the silicon substrate to form the metal silicide. That is, the metal layer capped on other material, such as the silicon nitride, does not form any change when being heated. Therefore, the function of selective capping may be achieved. Meanwhile, in the wet etching process after the first thermal process, the etching solution only removes the portions of the unreacted metal layer while the metal silicide obtained after the reaction is reserved to therefore achieve the function of selectively local capping. In other words, it is not necessary to use masks in the etching process to define the areas to be capped.

In the present invention, the metal layer enabling the self-alignment is not particularly restricted, and may be any metal material that enables selective reaction with different substrates. Preferably, the self-aligned metal layer is selected from the group consisting of cobalt, titanium, platinum, and tantalum. And most preferably, the self-aligned metal layer is cobalt.

The acid solution used in the present invention for removing the native oxide from the silica material is not restricted to any particular composition. Preferably, the acid solution is an inorganic strong acid, and more preferably the hydrofluoric acid.

In the present invention, the metal layer may be deposited on the polysilicon gate, the source, and the drain by way of plasma sputtering or chemical vapor deposition. The deposited metal layer preferably has a film thickness ranging between 30 Å and 200 Å, and more preferably between 50 Å and 180 Å.

In the present invention, the barrier layer is deposited on the metal layer by way of physical plasma sputtering or chemical vapor deposition. The deposited barrier layer preferably has a film thickness ranging between 50 Å and 250 Å, and more preferably between 80 Å and 220 Å. And, the barrier layer may be a titanium nitride (TiN) layer.

In the first time thermal process conducted in the present invention, the metal layer deposited on the zones for the polysilicon gate, the source, and the drain is subjected to thermal reaction through rapid thermal process (RTP), so that the metal layer reacts with the silicon substrate to form the metal silicide. And, the portions of the metal layer that do not react with the silicon substrate keep unchanged. The reaction is preferably conducted at a temperature ranging between 250° C. and 700° C., and more preferably between 300° C. and 600° C. The resulted metal silicide may be cobalt silicide, titanium silicide, platinum silicide, or tantalum silicide.

In the wet etching process in the present invention, the etching solution may be a strong acid or a strong alkaline, and is preferably hydrofluoric acid or potassium hydroxide.

In the second time thermal process conducted in the present invention, the metal layer deposited on the zones for the polysilicon gate, the source, and the drain is subjected to thermal reaction through rapid thermal process (RTP), so that the metal silicide is internally formed into a phase-inverted metal silicide structure to reduce the resistance value of the metal silicide. The reaction temperature for the second time thermal process is preferably ranging between 500° C. and 900° C., and more preferably between 550° C. and 850° C. The reaction produced metal silicide may be cobalt silicide, titanium silicide, platinum silicide, or tantalum silicide.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
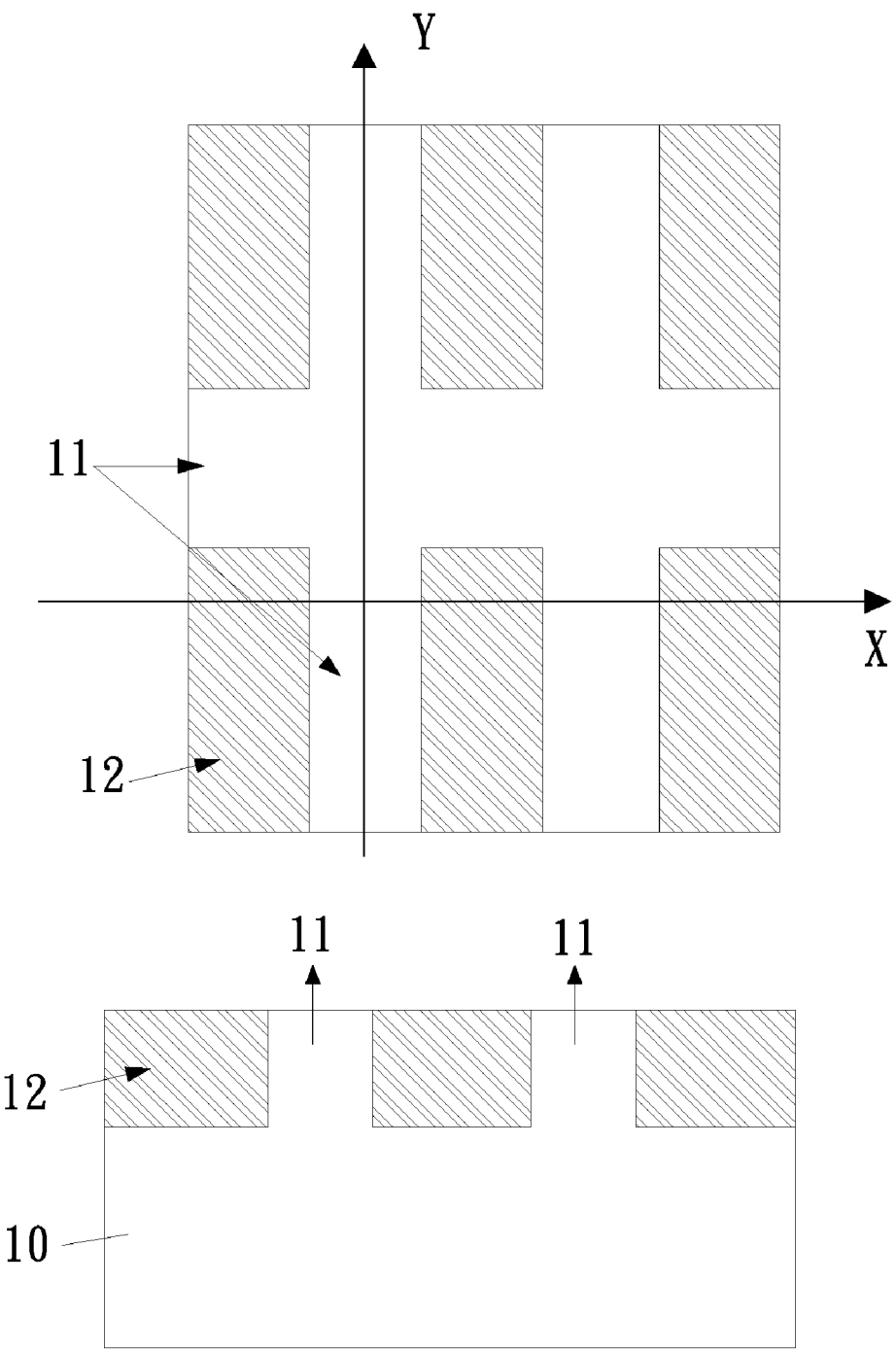
FIG. 1 shows a top view and a sectional view taken along x-axis of a silicon substrate having metal wires and trenches formed thereon.

Please refer to FIG. 1. In a process of forming a gate for a non-volatile memory cell, metal wires 11 and trenches 12 are formed on a silicon substrate, i.e., a silicon wafer 10, by etching and deposition process. Wherein, the metal wires 11 are aluminum, and the trenches 12 are filled with silica to serve as an insulating layer.

Figure 2:
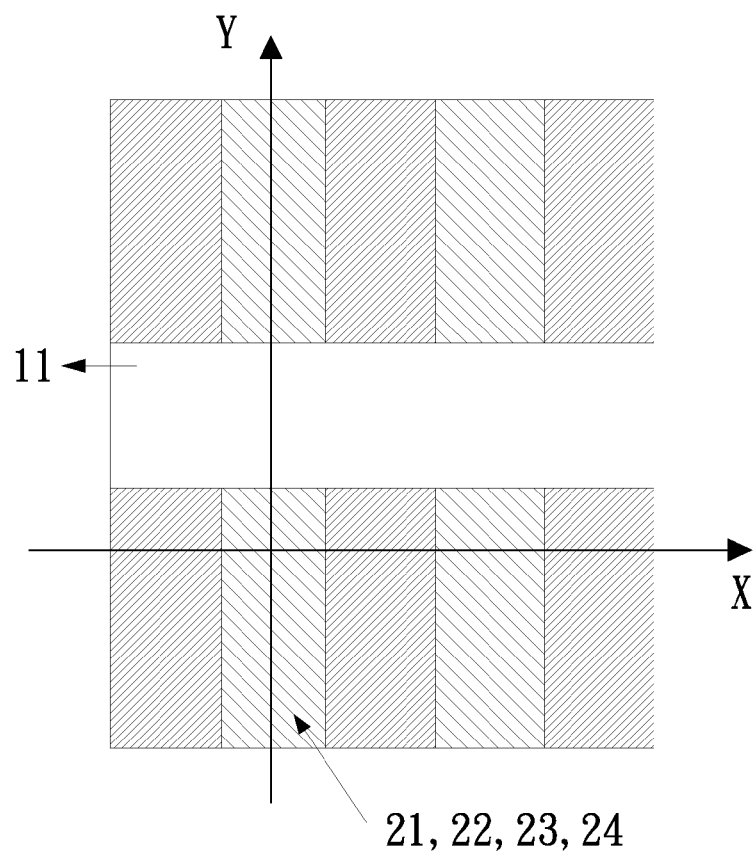
FIG. 2 includes a top view and a sectional view taken along x-axis showing the forming of an ONO structure and a polysilicon gate layer on the metal wires and trenches of FIG. 1.
Figure 2:
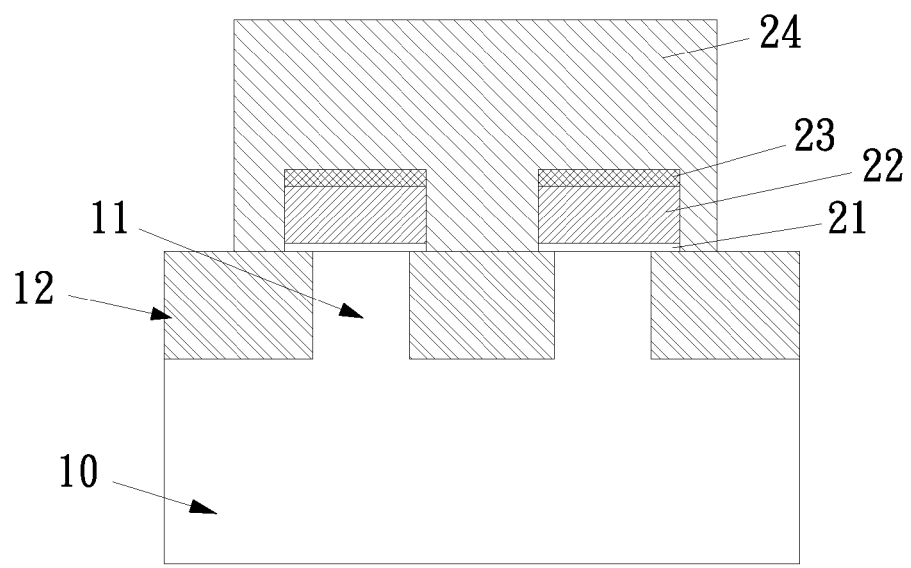

As shown in FIG. 2, a tunneling layer 21 formed of silica, a silicon nitride charge trapping layer 22, a silica isolation layer 23, and a polysilicon gate layer 24 are sequentially formed on the silicon substrate 10 from bottom to top.

Figure 3:
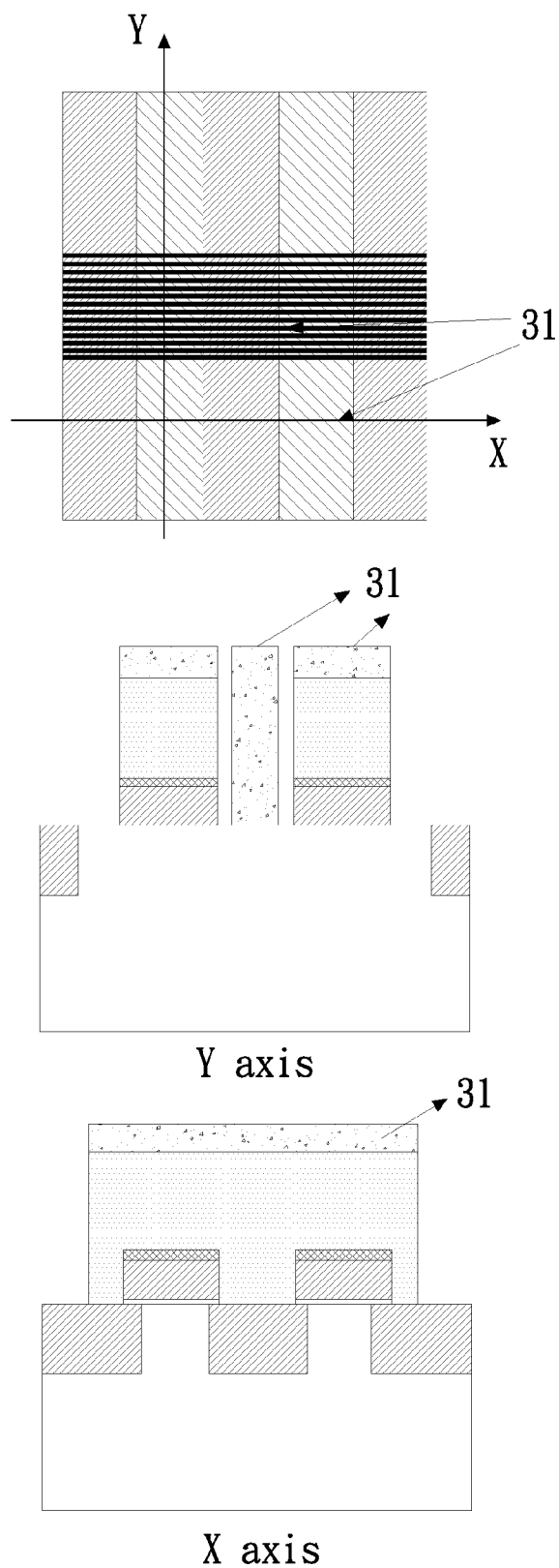
FIG. 3 shows the forming of a tungsten metal layer over the polysilicon gate according to a conventional technique.

According to a conventional technique as shown in FIG. 3, a tungsten metal layer 31 is then deposited over areas for forming the polysilicon gate 24, source, and drain (not shown). However, the tungsten metal layer 31 must further have a protection layer of silicon nitride and a photoresist layer (not shown) deposited thereon, and is then subjected to exposure, development, and etching to obtain a desired pattern.

Figure 4:
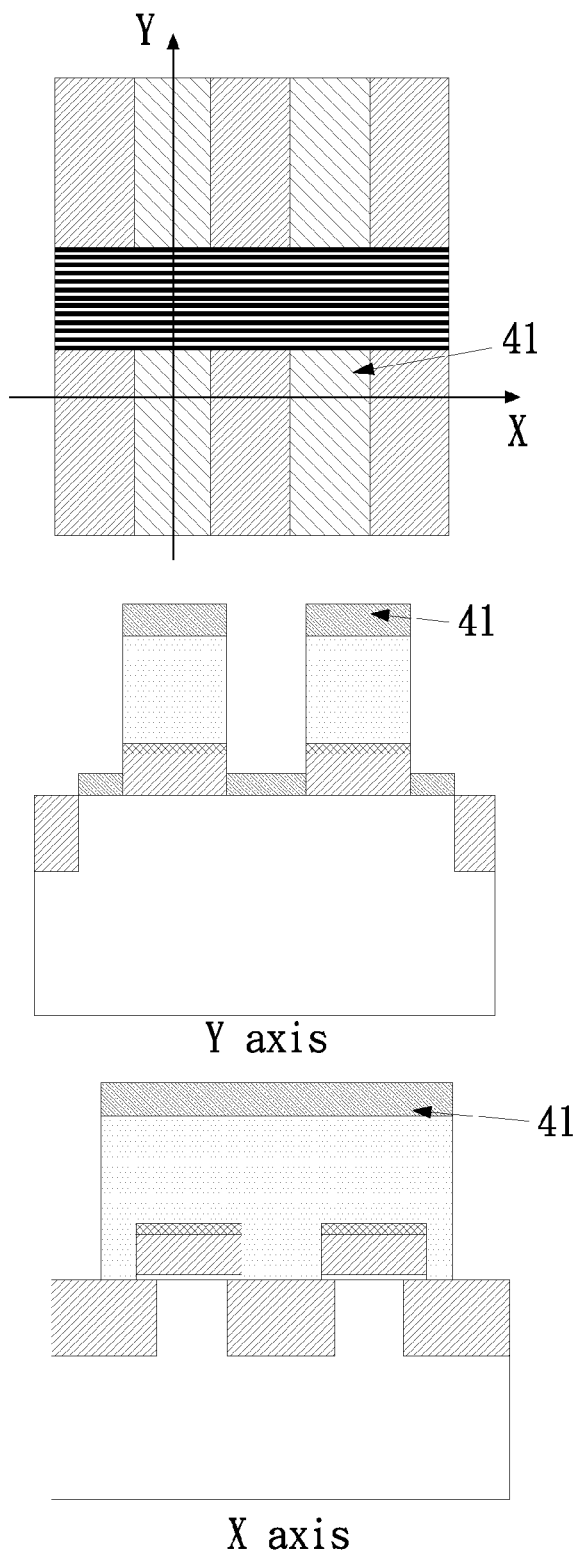
FIG. 4 shows the forming of a self-aligned metal silicide layer over the polysilicon gate according to the present invention.

However, according to the method of the present invention, as shown in FIG. 4, a cobalt metal layer having a thickness ranging from 50 Å to 180 Å is directly deposited on the polysilicon gate, the source, and the drain; and then, a barrier layer of titanium nitride having a thickness ranging from 80 Å to 220 Å is further deposited over the cobalt metal layer. After the deposition, a first time thermal process, which is a rapid thermal process (RTP) in the present invention, is conducted, so that a thermal reaction occurs between the metal layer and the silicon substrate to form a metal silicide at a reaction temperature ranging between 300° C. and 600° C. After the first thermal process, a cobalt silicide ($CoSi_2$) layer 41 is formed on the polysilicon gate. The $CoSi_2$ layer 41 is a self-aligned metal layer. Thereafter, use the wet etching process to remove the portions of the cobalt metal layer that do not react with the silicon substrate 10 to form the metal silicide. The etching solution used is hydrofluoric acid. The result obtained after the etching process is shown in FIG. 4. The cobalt silicide layer is self-aligned with and coated on the gate. Then, a second time of thermal process is conducted at a temperature ranging from 550° C. to 850° C., so that the metal silicide is internally formed into a phase-inverted metal silicide structure to decrease the resistance value of the metal silicide.

With the method of manufacturing non-volatile memory according to the present invention, the following advantages may be obtained in the forming of the polysilicon gate:

1. [0031] The use of the self-aligned metal silicide layer to replace the conventional tungsten metal layer in the manufacturing process for non-volatile memory may effectively avoid the problem of a deteriorated tungsten metal layer due to the subsequent high-temperature tempering process.
2. [0032] The use of marks may be saved in the process of etching the cap layer deposited on the polysilicon gate, so that the etching process is simplified and the overall manufacturing cost is reduced.

What is claimed is:

1. A method of manufacturing non-volatile memory using a self-aligned metal silicide, the method being performed on a silicon substrate having more than one memory cell, polysilicon gate, source, and drain, and comprising the following steps:

performing a washing process to remove a native oxide from a surface of the silicon substrate and then, forming a metal layer on zones for the polysilicon gates, the sources, and the drains, and on other zones by way of at least one of sputtering and chemical vapor deposition and then, forming a single barrier layer directly on the metal layer for protecting the metal layer against external air when the metal layer reacts with the silicon substrate to form a metal silicide, wherein the single barrier layer is a layer of only titanium nitride and then, subjecting the metal layer and the single barrier layer to a first time thermal process, so that the metal layer reacts with the silicon substrate to form a metal silicide and then, using a wet etching process to remove portions of the metal layer that do not react with the silicon substrate in the first time thermal process and remove the single barrier layer, so as to form a self-aligned metal silicide layer and then, conducting a second time thermal process on the self-aligned metal silicide layer, so that the metal silicide is internally formed into a phase-inverted metal silicide structure.

2. The method as claimed in claim 1, wherein the washing process uses hydrofluoric acid as an acid wash solution.

3. The method as claimed in claim 1, wherein the metal layer has a thickness ranging between 30 Å and 200 Å.

4. The method as claimed in claim 1, wherein the metal layer is selected from the group consisting of a cobalt metal layer, a titanium metal layer, a platinum metal layer, and a tantalum metal layer.

5. The method as claimed in claim 1, wherein the single barrier layer has a thickness ranging between 50 Å and 250 Å.

6. The method as claimed in claim 1, wherein the first time thermal process is conducted at a reaction temperature ranging between 250° C. and 700° C.

7. The method as claimed in claim 1, wherein the wet etching process uses hydrofluoric acid as an etching solution.

8. The method as claimed in claim 1, wherein the second time thermal process is conducted at a reaction temperature ranging between 500° C. and 900° C.

* * * * *